331-98 CROSS REFERENCE SEARCH ROOM

Aug. 24, 1965 V. MILLIQUET 3,202,943
BAND-PASS FILTER UTILIZING NESTED
DISTRIBUTED-PARAMETER RESONATORS
Filed Jan. 29, 1963 2 Sheets-Sheet 1

INVENTOR.
Vladimir Milliquet
BY
Pierce, Scheffler & Parker
ATTORNEYS

INVENTOR.
Vladimir Milliquet
BY
Pierce, Scheffler & Parker.
ATTORNEYS

United States Patent Office 3,202,943

Patented Aug. 24, 1965

3,202,943

BAND-PASS FILTER UTILIZING NESTED DISTRIBUTED-PARAMETER RESONATORS

Vladimir Milliquet, Baden, Switzerland, assignor to Patelhold Patentverwertungs-u. Elektro-Holding AG., Glarus, Switzerland Filed Jan. 29, 1963, Ser. No. 254,638

Claims priority, application Switzerland, Jan. 31, 1962, 1,222/62

1 Claim. (Cl. 333—73)

The present invention relates to band-pass filters with a plurality, such as five, tuned circuits at the output end of a power stage for use in television transmitter apparatus and has for a general object to provide such a filter apparatus which occupies an optimum minimal space.

In the construction of transmitters for television apparatus, it is usual to establish a frequency band for the transmitter as shown in FIG. 1 where $f_{BT}$ indicates the picture carrier frequency. This can, in accordance with an international agreement, be in band I and have for instance a value of 48.25 mc./s. Other carrier frequencies in this band which can be used are from 55.25 mc./s. to 62.25 mc./s. In band III the frequencies are 175.25 and 182.25 mc./s. and so on.

In order to obtain such a television frequency band, it is usual to employ a vestigial side-band filter with a frequency characteristic as shown in FIG. 1, this filter being located at the output end of a power stage. Such a band filter when consisting of known elements occupies a considerable amount of space. In accordance with the present invention, it is now possible for short wave-lengths, that is to say below 10 meters as in this case, to obtain a filter with the same characteristic but which occupies only a very small space.

The invention is thus directed to a band filter with five tuned circuits located at the output end of a power stage for a transmitter for wave lengths below 10 meters where the transmitter is of the smallest possible size.

In accordance with the invention three adjacent metallic casings are provided, whereby the anode circuit of the power stage is located in the first casing, and in the second casing there are provided three tunable nested box-like resonators, the outer resonator being connected to the output lead which passes through the third casing and inside the latter is coupled capacitatively with a spacing of approximately $\lambda/4$ to a resonator.

The invention will now be explained in more detail in reference to the accompanying drawings which illustrate a representative embodiment of the invention. In these drawings.

Figure 3:
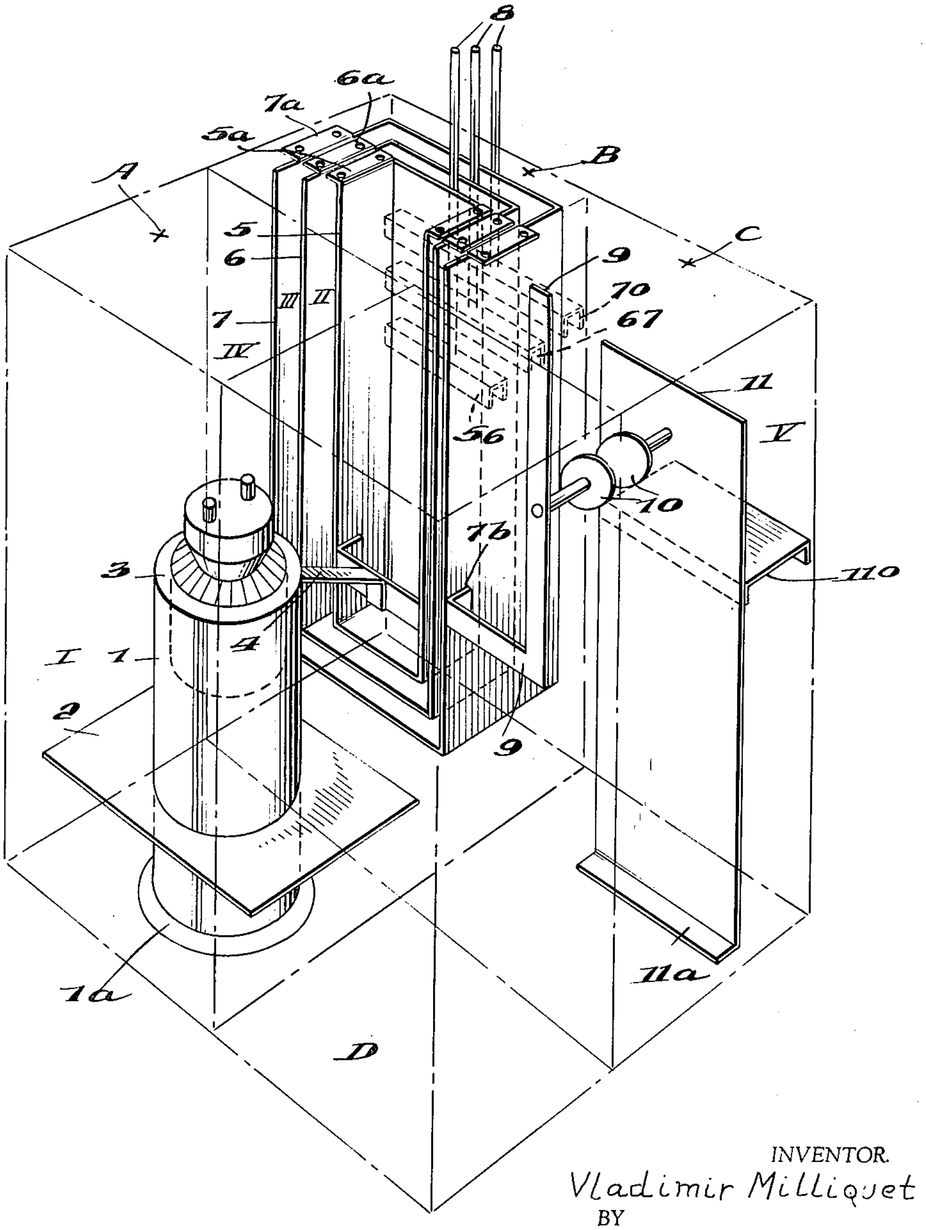
FIG. 3 is a somewhat diagrammatic view in perspective showing the assembly of the band filter in the three adjacent metallic casings A, B and C in accordance with the invention.

With reference now to the drawings and to FIG. 3 in particular, the first casing for the structure is indicated at A and within this is located the tuned anode circuit I of the power stage which consists of a co-axial oscillation circuit, namely, the tube 1 which is fixed to the floor of casing A at 1*a*.

A plate-shaped short-circuiting bridge 2 is provided for tuning purposes. This plate is equipped with sliding contacts, not shown in the figure, which establish contact with the wall of the casing A and also with tube 1. The power tube 3 is located inside of tube 1 and the anode of this power tube is coupled capacitatively to tube 1. The tuned circuit I is established by the wall of metallic housing A, the short-circuit bridge 2 and tube 1. Tuning of the co-axial oscillation circuit to the frequency $f_0$ lies above the picture carrier frequency $f_{BT}$, about in the middle of the pass band $f_{BT} \ldots f_2$.

Figure 4:
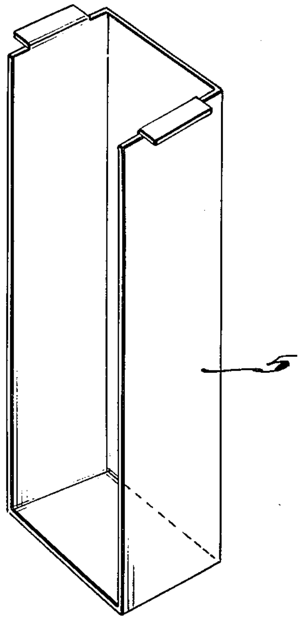
FIG. 4 is a perspective view of one of the bath-shaped resonators.

A connection 4 passes from casing A to the second casing B which adjoins casing A. Box-like tunable resonators 5, 6 and 7 made of copper plate and which fit into each other are located within casing B. Each resonator is seen to have the general configuration of a parallelepiped with one side wall and one end wall removed. The upper ends 5*a*, 6*a* and 7*a* respectively of these three resonators are fastened to the upper wall, not shown, of casing B. The three resonators located in casing B form the tuned oscillation circuits II, III and IV respectively whereby as regards circuit IV, metal casing B also forms a part. Sliding contacts form short-circuiting connections between two neighboring resonators. The connecting conductor 4 from tube 1 is joined to the innermost resonator 5. Sliding spring contacts 56, 67 and 70 are provided for tuning and these can be adjusted from the outside by means of rods 8. These sliding contacts form a short-circuiting bridge between the resonators or conductors 5 and 6, 6 and 7, and 7 and 0 (metallic casing). The box-like conductors 5, 6 and 7 enable the oscillation circuits II, III and IV to be assembled within a minimum of space. Moreover, these oscillation circuits can be constructed with extremely simple elements. Such a box-like resonator is shown in FIG. 4. Oscillation circuits II and III when in resonance have a blocking effect at frequencies $f_1$ and $f_2$ so that the slope of the transmission curve rises steeply. Oscillation circuit IV is also tuned to about the frequency $f_0$.

The tuned circuit II is established by resonators 5 and 6 and the tuning bridge 56. The tuned circuit III is established by resonators 6 and 7 and the tuning bridge 67. The tuned circuit IV is established by resonator 7 and the outer wall of metallic housing B and tuning bridge 70.

Figure 1:
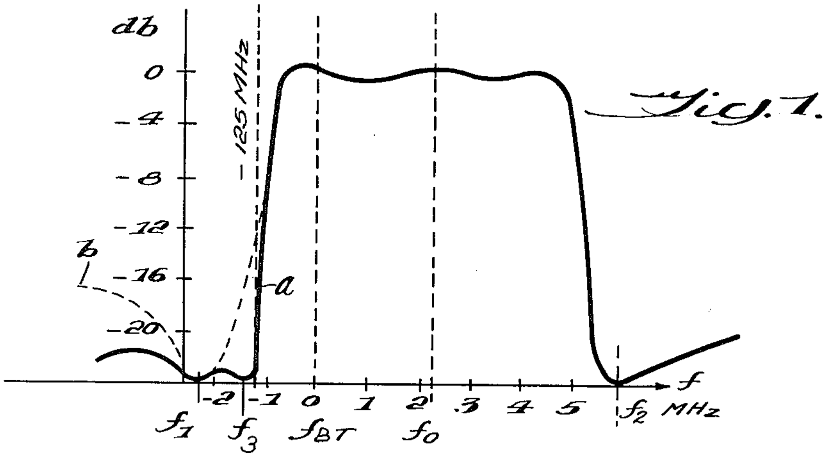
FIG. 1 is a graph showing the required frequency characteristic.

The outermost box-like resonator or conductor 7 is connected at terminal 7*b* to the output conductor 9. This conductor passes through the third metallic casing C located adjacent the casing structure B. At an electrical distance of about $\lambda/4$ of the output conductor 9 from terminal 7*b*, connection is established by way of a variable capacitor 10 with resonator conductor 11. $\lambda$ corresponds approximately to the wave-length of the picture carrier frequency $f_{BT}$. The output conductor acts on the length $\lambda/4$ for a definite frequency range as an impedance transformer. The resonator conductor 11 is fixed to the floor of casing C. The short-circuit bridge 110 in contact with a wall of the metallic casing C is provided for the exact adjustment of the resonance frequency which lies within the range between $f_{BT}$ and $f_2$. The resonator conductor 11 together with the variable coupling capacitor 10 form a tuned absorption circuit V, which is the last of the five tuned circuits involved. This circuit has a parallel resonance at the frequency $f_0$ and a series resonance at frequency $f_3$. It increases the steepness of the lower flank (*a*) of the frequency characteristic curve. Without this circuit, the characteristic curve would correspond approximately to the dotted line (*b*) in FIG. 1.

The power stage can be constructed basically also as a push-pull stage.

Figure 2:
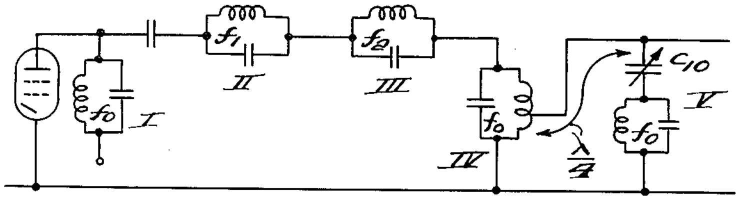
FIG. 2 is a circuit diagram showing the connections for the band filter with five tuned circuits I–V.

By means of the band-pass filter with five tuned circuits I to V as shown in FIG. 2 arranged in accordance with the invention, it is possible to accommodate the power stage together with the subsequent tuning apparatus in an extremely small space. The remaining space D within the overall parallelepiped structure established in part by the three casings A, B and C can be utilized to accommodate driver or pre-amplifier stages.

I claim:

In a band-pass filter structure for television transmitters having wavelengths below 10 meters, said filter structure having five tuned circuits at the output end of a power stage of the transmitter, the combination comprising first, second and third metallic casings each having a parallelepiped configuration arranged adjacent each other, said first casing containing the tuned anode circuit of the power stage, said second casing containing three tunable circuits constituted by three nested tunable box-like resonators and contact means slidable along and interconnecting adjacent walls of adjacent resonators for tuning said resonators, the outermost of said resonators being connected to an output conductor which passes through said third casing, and said third casing including a further tuned circuit constituted by a resonator and a variable capacitor, said output conductor being connected to last said resonator through said capacitor with a spacing of substantially one-fourth of the wavelength within the band-pass corresponding to the picture carrier frequency of the transmitter.

References Cited by the Examiner

UNITED STATES PATENTS

| | | | |
|---|---|---|---|
| 2,132,208 | 10/37 | Dunmore | 333—73 |
| 2,169,305 | 8/39 | Tunick | 333—73 |
| 2,220,922 | 4/41 | Trevor | 333—73 |
| 2,239,905 | 4/41 | Trevor | 333—73 |
| 2,408,927 | 10/46 | Gurewitsch | 333—73 |
| 2,411,299 | 11/46 | Sloan | 333—73 |

HERMAN KARL SAALBACH, *Primary Examiner.*